The United States Patent

Frerking

[19]

[11] 3,978,412

[45] Aug. 31, 1976

[54] RADIO RECEIVER NOISE SUPPRESSION

[75] Inventor: Marvin E. Frerking, Cedar Rapids, Iowa

[73] Assignee: Rockwell International Corporation, El Segundo, Calif.

[22] Filed: May 2, 1975

[21] Appl. No.: 574,054

[52] U.S. Cl................................ 325/478; 325/474
[51] Int. Cl.² ........................................ H04B 1/16
[58] Field of Search.................... 325/473, 474, 478; 307/109; 320/1; 340/173 CA

[56] References Cited
UNITED STATES PATENTS

| | | | |
|---|---|---|---|
| 3,142,822 | 7/1964 | Martin | 340/173 CA |
| 3,588,705 | 6/1971 | Loch et al. | 325/473 |
| 3,739,285 | 6/1973 | Hepp | 325/473 |
| 3,836,893 | 9/1974 | Lamden | 320/1 |
| 3,887,872 | 6/1975 | Sharpe | 325/473 |

Primary Examiner—Robert L. Richardson
Attorney, Agent, or Firm—Robert J. Crawford; Howard R. Greenberg

[57] ABSTRACT

Noise suppression in a radio receiver is accomplished by clamping the receiver detector output for a predetermined period each time the noise content in the receiver signal exceeds some predetermined threshold value.

16 Claims, 2 Drawing Figures

RADIO RECEIVER NOISE SUPPRESSION

BACKGROUND OF THE INVENTION

The invention disclosed herein was made under or in the course of a contract with the Department of the United States Air Force.

The invention pertains generally to the suppression of noise in radio receivers and has particular application to noise interference created by the emanation of periodic pulses in the vicinity of a receiver.

Radio receivers operating in close proximity to periodic pulse-type signal emanations such as from radar or automobile ignition systems are highly susceptible to undesirable noise interference created by the receiver picking up the pulse train as a radio signal. Although most of the frequency components contained in the signal pulses are filtered out by the radio receiver tuning and filtering circuitry, those components at or in the range of the carrier signal frequency to which the receiver is tuned pass through and are detected along with the desired radio signal which distorts the demodulated signal, thereby introducing possible signal errors and in the case of audio creating a displeasing effect quite noticeable to a listener, usually in the form of a buzz or a hum.

In the prior art, this type of noise interference has been combatted by including in a subject radio receiver a noise blanker circuit which monitors the receiver signal for noise and at some predetermined noise threshold level blocks the passage of the receiver signal to the detector for some predetermined period during which the interfering noise as well as the desired radio signal are not demodulated and therefore go unperceived. This blanking approach for suppressing noise works well so long as the period of the interfering signal pulses is short with respect to the bandwidth of the demodulated information since the blanking period can then likewise be kept short to minimize the radio signal energy lost and the signal excursions during each blanking period, and consequently the detector output signal perturbations arising therefrom. However, as the period of the signal pulses gets longer, as is now observed with certain types of radar signals, the greater blanking periods concomitantly required for successful noise suppression in the affected radio receivers results in detector output signals whose perturbations are perceivable and which therefore adversely affect the receiver performance.

With the foregoing in mind, it is a primary object of the present invention to provide a new and improved means for suppressing noise in radio receivers.

It is a further object of the present invention to accomplish such radio receiver noise suppression by minimizing the radio receiver detector output perturbations through a clamping technique with or without noise blanking.

The foregoing objects as well as others and the means by which they are achieved through the present invention may best be appreciated by referring to the Detailed Description of the Invention which follows hereinafter together with the appended drawing.

BRIEF DESCRIPTION OF THE INVENTION

The invention disclosed herein provides noise suppression for radio receivers by clamping the radio receiver detector output whenever the noise content in the receiver signal exceeds some predetermined threshold value. The clamping is made to last for some predetermined period which may vary in accordance with the duration of the excessive noise or preferably for a fixed period irrespective of noise duration which is designed to be greater than the pulse period for an anticipated pulse train. The clamping may be performed in conjunction with or without noise blanking.

In one preferred embodiment for the invention, a tracking signal is developed which tracks the output of the receiver detector so long as the receiver signal noise content is below the threshold level. As soon as the threshold level is exceeded, tracking is terminated and the last tracked value is maintained throughout the predetermined clamping period while being applied to the output of the receiver detector. Once the predetermined period has passed, tracking is resumed. When used in conjunction with a noise blanker circuit, the clamp initiating signal is derived from the noise blanker itself. In the absence of a noise blanker circuit, this signal can be derived from the pulse signal generator itself, if convenient, or in the more general case, a noise detection circuit can be employed to determine when noise threshold level has been exceeded.

In a second preferred embodiment for the invention wherein the radio receiver with a noise blanker utilizes an AM detector having a parallel resistor-capacitor combination across which the demodulated signal is developed, clamping is accomplished by opening a switch in series with the resistor in order to inhibit the capacitor from discharging.

DETAILED DESCRIPTION OF THE INVENTION

Figure 1:
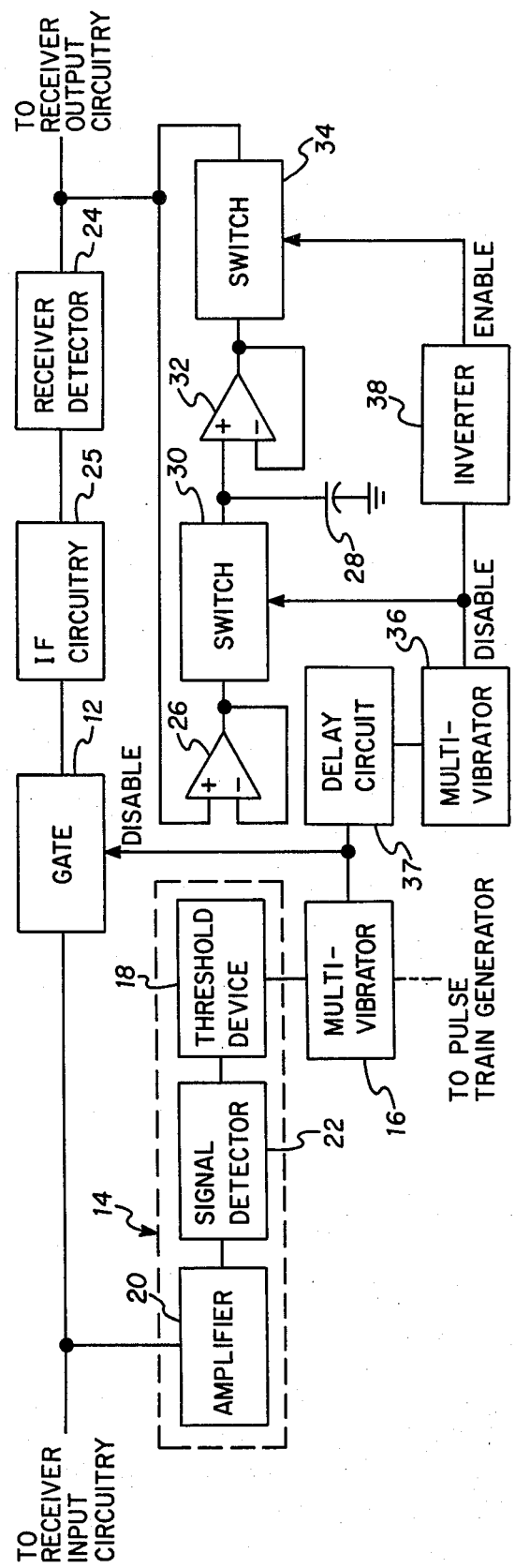
FIG. 1 is a block diagram which depicts the first preferred embodiment of the invention just described.

As shown in FIG. 1, a typical noise blanker circuit comprises a switching gate 12 (which could take any one of well known forms such as a field effect transistor switch or a pin diode switch) connected in series with the receiver signal path interconnecting the receiver input and output circuitry and a noise detection circuit 14 for controlling the operation of gate 12 through a control signal source such as multivibrator 16. When actuated, the multivibrator 16 provides an output signal to disable (open) gate 12 so as to block the passage of the receiver signal which occurs whenever the noise content in the receiver signal exceeds some predetermined threshold level established by a threshold device 18 in noise detection circuit 14. The multivibrator 16 can be of the bistable type in order to provide a disable signal for opening gate 12 coincident with the duration of the excessive noise (for example when the noise interference is random and therefore unpredictable) or as is more customary it can be of the one-shot type (where the noise interference is predictable such as created by a pulse train signal) for opening gate 12 for a fixed predetermined period each time excessive noise is detected irrespective of its duration. Since noise blanking is usually employed in conjunction with pulse trains whose pulse periods are fixed and known, the blanking period can be set equal to or greater than the pulse period to achieve successful noise suppression through the use of simplified equipment.

In addition to threshold device 18, noise detection circuit 14 contains an amplifier 20 to raise the receiver signal to an operative level and a conventional signal detector 22 (either AM or FM dependent on what type of modulation is being employed for the received radio signal) for demodulating the receiver signal before applying it to threshold device 18. The circuit details for threshold device 18 will of course depend on the noise detecting technique employed in ascertaining noise content. For example, if the noise criterion is to be amplitude related, viz. unacceptable noise content being considered to be present whenever the actual demodulated receiver signal level exceeds the normally expected radio signal sans noise level by some predetermined factor (such as ten to one), then an amplitude level threshold device such as a Schmitt trigger can be used. If the noise presence criterion is to be based on rate of change of the demodulated signal, the rate of change of noise being considered higher than that of the desired radio signal, then a differentiating circuit for setting a rate of change threshold level can be used either with or without the amplitude threshold device, depending on the degree of sophistication desired or required. Whichever noise detection technique is used, amplitude or rate of change, once the predetermined threshold level established by the threshold device 18 is exceeded in the demodulated output of signal detector 22, threshold device 18 actuates multivibrator 16 causing gate 12 to open.

As further shown in FIG. 1, multivibrator 16 can be alternatively controlled directly from the pulse signal generating source itself when convenient, thereby obviating the need for the noise detection circuit 14. With this arrangement, since it is assumed that the presence of each radio generated pulse in the vicinity of the receiver gives rise to noise interference, the multivibrator is actuated in direct response to the electronic pulse at the generator output rather than by measurement of the noise interference effects after the radio pulse is received by the radio receiver.

Gate 12 is of course placed before the receiver detector 24 whose output provides the demodulated information (the detector 24 being AM or FM dependent on the carrier signal modulation) and preferably before the IF circuitry 25 which precedes detector 24 in order to avoid the detrimental effects of dissipating noise signal energy in the IF circuitry 25 if it were allowed to be applied thereto.

The output of receiver detector 24 is connected to the non-inverting input of an operational amplifier 26 whose output is fed back to its inverting input so that it functions as a voltage follower. The output of operational amplifier 26 is connected to a capacitor 28 through a switching element 30. Capacitor 28 is connected to the non-inverting input of another operational amplifier 32 also connected as a voltage follower whose output is connected to the output of receiver detector 24 through another switching element 34. Both switching elements 30 and 34, which may simply be field effect transistors, are complementarily controlled (when one is open, the other is closed) from the output of a multivibrator 36 whose input is connected to the output of multivibrator 16, preferably, through a delay circuit 37. Multivibrator 36, which like multivibrator 16, may be of either the bistable or one-shot type (dependent on whether or not its actuation period is to be fixed), is actuated simultaneously with multivibrator 16 in the absence of delay circuit 37 or a prescribed time after the actuation of multivibrator 16 with delay circuit 37 to disable switch 30 while simultaneously enabling switch 34 via inverter 38. It will be readily seen that when multivibrator 36 is not actuated along with multivibrator 16, as they would not be in the absence of excessive noise in the receiver signal, switch 30 is closed to connect capacitor 28 across the output of receiver detector 24 through voltage follower 26. The high input impedance and low output impedance of voltage follower 26 permits capacitor 28 to develop a tracking signal which tracks the signal output of receiver detector 24 without loading it down. At this time, switch 34 is open to prevent feedback problems. Whenever the predetermined noise threshold level is exceeded, the actuation of multivibrator 36 in response to that of multivibrator 18, causes switch 30 to open and switch 34 to close thereby placing capacitor 28 across the output of receiver detector 24 via voltage follower 32. The high input impedance presented to capacitor 28 by voltage follower 32 and its low impedance presented to the output of signal detector 24, clamps the receiver detector 24 output to the last tracked value prior to the opening of switch 30. Clamping of the output of receiver detector 24 during the noise blanking period when gate 12 is open, improves receiver performance by restricting signal excursions and minimizing radio signal energy loss and consequently the perceivable perturbations resulting therefrom during this period. Even in the absence of noise blanking, in which case gate 12 would not be included in the receiver, performance is improved by countering the tendency of the detector 24 output to rise due to passage of the interfering signal pulse with the clamping action of the invention. Inclusion of delay circuit 37 in conjunction with noise blanking permits the clamping action to be initiated some short time after noise blanking occurs after all the usable signal energy in the IF circuitry 25 has been maximally utilized.

Figure 2:
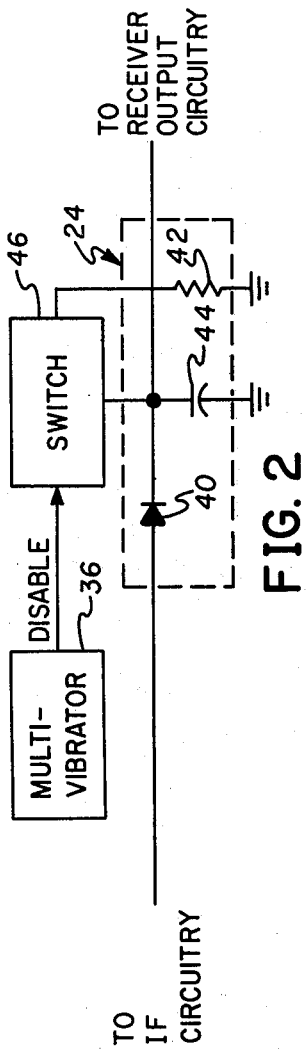
FIG. 2 depicts the second embodiment of the invention just described for use in conjunction with a conventional AM detector.

When the radio receiver is of the AM type employing a conventional signal detector such as shown in FIG. 2, which comprises a diode 40 and a resistor 42 connected in parallel with a capacitor 44 across which the AM demodulated signal is developed, the invention can be implemented with less sophisticated and expensive equipment if a lower quality of performance is acceptable. A switch 46, for instance of the field effect transistor type, placed in series with resistor 42 is opened in response to the actuation of multivibrator 36 thereby inhibiting the discharge of capacitor 44 during the noise blanking period to restrict signal excursions and signal energy loss. Following this period, switch 46 closes to permit signal detector 24 to resume normal operation. It will be readily appreciated that the less sophisticated invention embodiment depicted in FIG. 2 is only viable in conjunction with noise blanking since in this case the clamping action afforded by disconnecting resistor 42 acts only to keep the signal output from decreasing and not rising.

As demonstrated by the foregoing, the invention provides a simple, yet effective clamping action, with or without noise blanking, for suppressing noise in radio receivers, particularly that which is created by pulse train signal interference. Since the exemplification of the invention in its preferred embodiments herein can undoubtedly be modified by those skilled in the art without departing from the scope and spirit of the invention, the foregoing detailed disclosure is intended to be merely illustrative and not restrictive of the invention as will now be claimed hereinbelow.

What is claimed is:

1. A noise suppression circuit for use in a radio receiver having a noise blanker circuit which is actuated to block the passage of receiver signals to the receiver detector whenever the noise content exceeds some predetermined threshold level, comprising:
   clamp circuit means having an output signal which tracks an input signal applied thereto and maintains the last tracked level during a subsequent absence of input signal, and
   switching circuit means for connecting to the radio receiver detector output, the output of said clamp circuit means for a predetermined period each time the noise blanker circuit is actuated and the input of said clamp circuit means at all other times.

2. The noise suppression circuit of claim 1 wherein said clamp circuit means comprises a voltage follower for providing said output signal and a capacitor connected to the input of said voltage follower for receiving said input signal.

3. The noise suppression circuit of claim 2 wherein said switching circuit means includes a voltage follower through which the radio receiver detector output signal is applied to the input of said clamp circuit means.

4. A radio receiver noise suppression circuit, comprising:
   noise detection circuit means for providing a control signal whenever the receiver signal noise content exceeds some predetermined threshold level;
   clamp circuit means having an output signal which tracks an input signal applied thereto and maintains the last tracked level during a subsequent absence of any input signal, and
   switching circuit means for connecting to the radio receiver detector output, the output of said clamp circuit means for a predetermined period each time said control signal is received and the input of said clamp circuit means at all other times.

5. The radio receiver noise suppression circuit of claim 4 wherein said clamp circuit means comprises a voltage follower for providing said output signal and a capacitor connected to the input of said voltage follower for receiving said input signal.

6. The radio receiver noise suppresion circuit of claim 5 wherein said switching circuit means includes a voltage follower through which the radio receiver detector output signal is applied to the input of said clamp circuit means.

7. The radio receiver noise suppression circuit of claim 4 including gating circuit means for blocking the passage of the receiver signal to the receiver detector for a predetermined period each time said control signal is received.

8. A radio receiver noise suppression circuit, comprising:
   noise detection circuit means for providing a control signal whenever the receiver signal noise content exceeds some predetermined threshold level, and
   clamp circuit means for clamping the radio receiver detector output for a predetermined period each time said control signal is received.

9. The radio receiver noise suppression circuit of claim 8 wherein the radio receiver includes a noise blanker circuit responsive to said control signal and the radio receiver detector output includes a parallel resistor-capacitor combination across which an AM demodulated signal is developed and said clamp circuit means comprises a switching means in series with the resistor which is opened in response to said control signal to inhibit the capacitor from discharging.

10. A means of suppressing noise in a radio receiver, comprising:
    generating a control signal whenever the receiver signal noise content exceeds some predetermined threshold level, and
    clamping the radio receiver detector output for a predetermined period in response to each control signal.

11. The noise suppressing means of claim 10 including blocking the passage of the receiver signal to the receiver detector for a predetermined period in response to each control signal.

12. The noise suppressing means of claim 11 wherein the radio receiver detector includes a parallel resistor-capacitor combination across which an AM demodulated signal is developed and said clamping is accomplished by opening the resistor current path to inhibit the capacitor from discharging.

13. The noise suppressing means of claim 10 wherein said clamping is accomplished by developing a signal which tracks the radio receiver detector output until a control signal is received and maintains the last tracked level for said predetermined period thereafter and applying the developed signal to the detector output in response to each control signal.

14. A circuit for suppressing noise in a radio receiver created by interfering pulses contained in a generated signal pulse train, comprising:
    means for providing a control signal each time an interfering pulse is generated;
    clamp circuit means having an output signal which tracks an input signal applied thereto and maintains the last tracked level during a subsequent absence of any input signal, and
    switching circuit means for connecting to the radio receiver detector output, the output of said clamp circuit means for a predetermined period each time said control signal is received and the input of said clamp circuit means at all other times.

15. The noise suppressing circuit of claim 14 wherein said clamp circuit means comprises a voltage follower for providing said output signal and a capacitor connected to the input of said voltage follower for receiving said input signal.

16. The noise suppression circuit of claim 15 wherein said switching circuit means includes a voltage follower through which the radio receiver detector output signal is applied to the input of said clamp circuit means.

* * * * *